US007015183B2

(12) United States Patent
Baik et al.

(10) Patent No.: US 7,015,183 B2
(45) Date of Patent: Mar. 21, 2006

(54) RESIST REMOVER COMPOSITION

(75) Inventors: Ji-Hum Baik, Kyungki-do (KR);
Chang-Il Oh, Seongnam (KR);
Chong-Soon Yoo, Kyungki-do (KR)

(73) Assignee: Dongjin Semichem Co., Ltd., Incheon (KR)

( * ) Notice: Subject to any disclaimer, the term of this patent is extended or adjusted under 35 U.S.C. 154(b) by 97 days.

(21) Appl. No.: 10/478,113

(22) PCT Filed: May 21, 2001

(86) PCT No.: PCT/KR01/00839

§ 371 (c)(1),
(2), (4) Date: Nov. 18, 2003

(87) PCT Pub. No.: WO02/095502

PCT Pub. Date: Nov. 28, 2002

(65) Prior Publication Data

US 2005/0101500 A1  May 12, 2005

(51) Int. Cl.
C11D 7/32  (2006.01)
C11D 7/50  (2006.01)

(52) U.S. Cl. ............... 510/176; 510/175; 510/212; 510/499; 134/2; 134/3; 438/745; 438/906

(58) Field of Classification Search .............. None
See application file for complete search history.

(56) References Cited

U.S. PATENT DOCUMENTS

| 4,617,251 A | 10/1986 | Sizensky ............ 430/256 |
| 4,770,713 A | 9/1988 | Ward .............. 134/38 |
| 6,140,027 A | 10/2000 | Baik et al. ............ 430/331 |
| 6,265,309 B1* | 7/2001 | Gotoh et al. .......... 438/637 |
| 6,364,544 B1* | 4/2002 | Sasayama et al. ....... 396/578 |
| 6,514,352 B1* | 2/2003 | Gotoh et al. ............ 134/3 |
| 6,774,097 B1* | 8/2004 | Yoon et al. ............ 510/176 |
| 6,861,210 B1* | 3/2005 | Baik et al. ............ 430/331 |

FOREIGN PATENT DOCUMENTS

| DE | 3828513 A1 | 3/1990 |
| JP | 63-208043 | 8/1988 |
| JP | 63-231343 | 9/1988 |
| JP | 64-042653 | 2/1989 |
| JP | 62-50831 | 2/1990 |
| JP | 04-124668 | 4/1992 |
| JP | 04-289866 | 10/1992 |
| JP | 04-350660 | 12/1992 |
| JP | 05-281753 | 10/1993 |
| JP | 06-249355 | 9/1994 |

(Continued)

Primary Examiner—Gregory Webb
(74) Attorney, Agent, or Firm—Baker Botts L.L.P.

(57) ABSTRACT

The present invention relates to a resist remover composition for removing resists during manufacturing processes of semiconductor devices such as integrated circuits, large scale integrated circuits and very large scale integrated circuits. The composition comprises (a) 10 to 40 wt. % of a water-soluble organic amine compound, (b) 40 to 70 wt. % of water-soluble organic solvents selected from a group consisting of dimethyl sulfoxide (DMSO), N-methyl pyrrolidone (NMP) dimethylacetamide (DMAc), dimethylformamide (DMF) and a mixture thereof, (c) 10 to 30 wt. % of water, (d) 5 to 15 wt. % of an organic phenol compound containing two or three hydroxyl groups, (e) 0.5 to 5 wt. % of anion type compound containing perfluoroalkyl, and (f) 0.01 to 1 wt. % of a polyoxyethylenealkylamine ether-type surfactant.

6 Claims, 2 Drawing Sheets

FOREIGN PATENT DOCUMENTS

| | | |
|---|---|---|
| JP | 06-266119 | 9/1994 |
| JP | 07-069618 | 4/1995 |
| JP | 08-123043 | 5/1996 |
| JP | 08-262746 | 10/1996 |
| JP | 09-096911 | 4/1997 |
| JP | 09-152721 | 6/1997 |
| JP | 11-305453 | 11/1999 |
| WO | WO 01/14934 A1 | 3/2001 |

* cited by examiner

RESIST REMOVER COMPOSITION

BACKGROUND OF THE INVENTION (a) Field of the Invention

The present invention relates to a remover composition for removing resists during a manufacturing process of semiconductor devices such as integrated circuits (IC), large scale integrated circuits (LSI) and very large scale integrated circuits (VLSI).

(b) Description of the Related Art

Generally, manufacturing processes of semiconductor devices employ dozens of lithography processes that comprise forming a resist pattern on a conductive layer formed on a semiconductor substrate, and then etching a part of the conductive layer that is not covered by the pattern to remove it, thereby forming a conductive layer pattern using the pattern as a mask. The resist pattern used as a mask must be removed from the conductive layer with resist remover during the stripping process after the conductive layer pattern forming process. However, since in recent very large scale integrated circuit semiconductor manufacturing, a dry etching process for forming conductive layer patterns has been conducted, it has become difficult to remove resists in a subsequent stripping process.

In a dry etching process which replaces a wet etching process using liquid phase acids, the etching process is conducted using a gas-phase/solid-phase reaction between plasma etching gases and layers such as the conductive layer. Dry etching forms the main stream of recent etching processes, because it is easy to control and can obtain a sharp pattern. However, since during a dry etching process, ions and radicals of plasma etching gases cause complex chemical reactions with the resist film on its surface and rapidly cure it, it becomes difficult to remove the resist. Particularly, in the case of dry etching of a conductive layer such as tungsten and titanium nitride, the generated side-wall resists that have been cured and modified are difficult to remove even if various chemicals are used.

A recently suggested resist remover composition comprising hydroxylamine and aminoethoxyethanol has been widely used because of its properties of effectively removing most cured resist films. However, said remover composition causes serious corrosion of copper wiring metal layers that are applied in semiconductor manufacturing lines of 1 giga DRAM or more, instead of aluminum wiring. Thus, there is a need for the development of a novel resist remover that can compensate for this problem.

Meanwhile, a recently suggested resist remover composition comprising alkanol amine and diethyleneglycol monoalkyl ether has been widely used because it has little odor and toxicity and exhibits effective removing performance for most resist films. However, it has also been found that said remover composition cannot sufficiently remove resist film exposed to plasma etching gases or ion beams in a dry etching process or an ion implantation process. Thus, there has been a need for the development of a novel resist remover that can remove resist film modified by the dry etching and ion implantation processes.

As stated above, it is difficult to remove resist film that has undergone the ion implantation process using resist remover. Particularly, it is more difficult to remove resist film that has undergone the ion implantation process with high radiation dose for forming the source/drain area in the very large scale integrated circuit manufacturing process. During the ion implantation process, the surface of the resist film is cured mainly due to reaction heat from the high-energy ion beams and the high radiation dose. In addition, popping of the resist occurs which generates resist residues. Commonly, a semiconductor wafer that is ashing-treated is heated to a high temperature of 200° C. or more. At this time, solvent remaining inside the resist should be evaporated and exhausted, which is not possible because a cured layer exists on the surface of the resist after the ion implantation process with a high radiation dose.

Accordingly, as ashing proceeds, internal pressure of the resist film increases and the surface of the resist film is ruptured by solvent remaining inside, which is referred to as popping. The surface cured layer dispersed by such popping becomes residue, and thus it is difficult to remove. In addition, since the cured layer on the surface of the resist forms by heat, impurity ions, or dopants, are substituted in the structure of resist molecules to cause a cross-linking reaction, and the reacted area is oxidized by O2 plasma. Thus the oxidized resist changes into residues and particles to become contaminants, which lower the production yield of very large scale integrated circuit manfacture.

Many dry and wet etching processes for effectively removing the resist cured layer have been suggested, one of which is a two step ashing method comprising conducting common ashing and following with a second ashing process as described in Fujimura, Japanese Spring Application Physical Society Announcement, 1P-13, p574, 1989. However, these dry etching processes are complicated, they require a lot of equipment and they lower production yield.

In addition, a resist remover composition comprising an organic amine compound and various organic solvents has been suggested as a resist remover used in a conventional wet stripping process. Specifically, a resist remover composition containing monoethanolamine (MEA) as the organic amine compound is widely used.

As examples, a two-component system resist stripper composition comprising a) organic amine compounds such as monoethanolamine (MEA), 2-(2-aminoethoxy)ethanol (AEE), etc., and b) polar solvents such as N,N-dimethylacetamide (DMAc), N,N-dimethylformamide (DMF), N-methylpyrrolidone (NMP), dimethylsulfoxide (DMSO), carbitol acetate, methoxyacetoxypropane, etc. (U.S. Pat. No. 4,617,251); a two-component system resist stripper composition comprising a) organic amine compounds such as monoethanolamine (MEA), monopropanolamine, methylamylethanol, etc., and b) amide solvents such as N-methylacetamide (Mac), N,N-dimethylacetamide (DMAc), N,N-dimethylformamide (DMF), N,N-dimethylpropionamide, N,N-diethylbutylamide, N-methyl-N-ethylpropionamide, etc. (U.S. Pat. No. 4,770,713); a two-component system resist stripper composition comprising a) organic amine compounds such as monoethanolamine (MEA), and b) nonprotonic polar solvents such as 1,3-dimethyl-2-imidazolidinone (DMI), 1,3-dimethyl-tetrahydropyrimidinon, etc. (German Laid-Open Patent Application No. 3,828,513); a resist stripper composition comprising a) ethylene oxide-introduced alkylene polyamines of alkanol amines such as monoethanolamine (MEA), diethanol amine (DEA), triethanolamine (TEA), etc., and ethylenediamine, b) sulfone compounds such as sulforane, etc., and c) glycol monoalkyl ethers such as diethylene glycol monoethyl ether, diethylene glycolmonobutyl ether, etc., in a specific ratio (Japanese Laid-open Patent Publication No. Sho 62-49355); a resist stripper composition comprising a) water soluble amines such as monoethanol amine (MEA), diethanolamine (DEA), etc., and b) 1,3-dimethyl-2-imidazolidinone (Japanese Laid-open Patent Publication No. Sho 63-208043); a positive resist stripper composition comprising a) amines such as monoethanolamirie (MEA), ethylenediamine, piperidine, benzyl amine, etc., b) polar solvents such as DMAc, NMP, DMSO, etc., and c) a surfactant (Japanese Laid-open Patent Publication No. Sho 63-231343); a positive resist stripper composition comprising a) nitrogen-containing organic hydroxy compounds such as monoethanolamine (MEA), b) one or more solvents selected from diethylene glycol monoethyl ether, diethyleneglycol dialkyl ether, γ-butyrolactone and 1,3-dimethyl-2-imidazolinone, and c) DMSO in a specific ratio (Japanese Laid-open Patent Publication No. Sho 64-42653); a positive resist stripper composition comprising a) organic amine compounds such as monoethanolamine (MEA), etc., b) a non-protonic polar solvent such as diethylene glycol monoalkyl ether, DMAc, NMP, DMSO, etc., and c) a phosphate ester surfactant (Japanese Laid-open Patent Publication No. Hei 4-124668); a resist stripper composition comprising a) 1,3-dimethyl-2-imidazolidinone (DMI), b) dimethylsulfoxide (DMSO), and c) organic amine compounds such as monoethanolamine (MEA), etc. (Japanese Laid-open Patent Publication No. Hei 4-350660); and a resist stripper composition comprising a) monoethanolamine (MEA), b) DMSO, c) catechol (Japanese Laid-open Patent Publication No. Hei 5-281753) have been suggested and these resist stripper compositions show relatively good properties in terms of their stabilities, processabilities and resist removing performances.

However, one of the recent tendencies of semiconductor device manufacturing processes is treating various substrates including silicon wafers at a high temperature of 110 to 140° C., and thus resists are often baked at high temperatures. However, said resist strippers do not have sufficient capabilities for removing resists that are baked at high temperatures. As compositions for removing the hard baked resists, resist remover compositions containing water and/or hydroxylamine have been suggested. As examples, a resist stripper composition comprising a) hydroxylamines, b) alkanol amines, and c) water (Japanese Laid-open Patent Publication No. Hei 4-289866; a resist stripper composition comprising a) hydroxylamines, b) alkanol amines, c) water and d) anti-corrosives (Japanese Laid-open Patent Publication No. Hei 6-266119); a resist stripper composition comprising a) polar solvents such as GBL, DMF, DMAC, NMP, etc., b) aminoalcohols such as 2-methylaminoethanol, and c) water (Japanese Laid-open Patent Publication No. Hei 7-69618); a stripper composition comprising a) aminoalcohols such as monoethanolamine (MEA), b) water, and c) butyidiglycol (Japanese Laid-open Patent Publication No. Hei 8-123043); a resist stripper composition comprising a) alkanolamines, alkoxyamines, b) glycol monoalkyl ether, c) sugar alcohols, d) quaternary ammonium hydroxide, and e) water (Japanese Laid-open Patent Publication No. Hei 8-262746); a stripper composition comprising a) one or more alkanolamines of monoethanolamine (MEA) or AEE, b) hydroxylamine, c) diethyleneglycol monoalkyl ether, d) sugars (sorbitol), and e) water (Japanese Laid-open Patent Publication No. Hei 9-152721); a resist stripper composition comprising a) hydroxylamines, b) water, c) amines having an acid dissociation constant (pKa) of 7.5 to 13, d) water soluble organic solvent, and e) an anticorrosive (Japanese Laid-open Patent Publication No. Hei 9-96911) have been suggested.

However, said resist stripper compositions are not satisfactory in terms of either their removing performances for resist films cured by dry etching, ashing and ion implantation processes and those modified by metallic side-products etched from lower metal film materials during said processes, or anti-corrosive performances of lower metal wiring during the resist removal process.

SUMMARY OF THE INVENTION

It is an object of the present invention to provide a resist remover composition that can easily and quickly remove resist films cured and modified by dry etching, ashing and ion implantation processes and those modified by metallic side-products etched from metal film-materials during said processes at a low temperature, and which can minimize the corrosion of lower metal wiring, particularly copper wiring.

In order to achieve these objects, the present invention provides a resist remover composition comprising a) 10 to 40 wt % of water-soluble organic amine compounds, b) 40 to 70 wt % of water-soluble organic solvents selected from a group consisting of dimethylsulfoxide (DMSO), N-methylpyrrolidone (NMP), dimethylacetamide (DMAc) and dimethylformamide (DMF), (c) 10 to 30 wt % of water, (d) 0.1 to 15 wt % of organic phenol compounds containing two or three hydroxyl groups, (e) 0.01 to 10 wt % of anion type compounds containing a perfluoroalkyl group, and (f) 0.01 to 1 wt % of polyoxyethylenealkyl amine ether-type surfactant.

The resist remover composition of the present invention preferably uses an amino alcohol compound as the (a) water-soluble organic amine compound, and it is preferably selected from a group consisting of 2-amino-1-ethanol, 1-amino-2-propanol, 2-amino-propanol, 3-amino-1-propanol and a mixture thereof, among which 2-amino-1-ethanol is most preferable in terms of its resist infiltration and swelling properties, viscosity and costs.

The content of the water-soluble organic amine is preferably 10 to 40 wt %. If the content is less than 10 wt %, the composition cannot completely remove resist films modified by the dry etching process, etc, and if the content exceeds 40 wt %, the corrosion of lower metal wiring layer materials such as silicon oxide and copper, etc. will be excessive.

The (b) water-soluble organic solvent is preferably selected from a group consisting of dimethylsulfoxide (DMSO), N-methylpyrrolidone (NMP), dimethylacetamide (DMAc), dimethylformamide (DMF) and a mixture thereof, among which NMP is more preferable in terms of its good solubility for a resist, prevention of redeposition of resist and the ease of wasted liquor treatment due to its fast biodegradation.

The (c) water is preferably pure water filtered through an ion exchange resin, and more preferably deionized water having a resistivity of 18 MΩ or more.

The water content is preferably 10 to 30 wt %. If the content is less than 10 wt %, the capability for removing resists seriously modified by metallic side-products produced after dry etching and ashing processes will be lowered. However, if the content exceeds 30 wt %, there is a concern about the corrosion of lower metal wiring during a removal process, and the contents of the (a) water-soluble organic amine and (b) the water-soluble organic solvents will be comparatively decreased, which results in the decrease in the strippability for resists that have not been modified. The results of studies have confirmed that the water content is most preferably 10 to 30 wt %.

The (d) organic phenol compound containing two or three hydroxyl groups is preferably the compound represented by the following Formula 1.

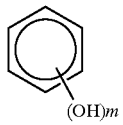

[Formula 1]

Wherein m is an integer of 2 or 3.

The organic phenol compound containing two or three hydroxyl groups, which is used to remove resist films cured by dry etching, ashing and ion implantation processes and those modified by metallic side-products etched from lower metal film materials, effectively infiltrates hydroxide ions produced by the reaction between the water-soluble organic amine compound and hydrogen ions of water into the contact surface between the resist film and the semiconductor substrate. In addition, the organic phenol compound containing two or three hydroxyl groups prevents hydroxyl groups produced from the resist remover composition from corroding lower metal film materials.

The content of the organic phenol compound containing two or three hydroxyl groups is preferably 0.1 to 10 wt %. If the content is less than 0.1 wt %, the strippabiltiy for resist films that have been seriously modified by metallic side-products produced after dry etching and ion implantation processes will be lowered, and the corrosion of lower metal film materials will be serious. If the content exceeds 10 wt %, it will be uneconomical from an industrial viewpoint considering manufacturing costs.

The (e) anion type compound containing perfluoroalkyl groupc is preferably selected from a group consisting of the compounds represented by the following Formula 2:

$$R_fCOO^-M^+$$

$$R_fSO_3.M^+$$

$$R_fSO_4^-M^+$$

$$R_fOP(O)O_2^{2-}M_2^+$$ [Formula 2]

Wherein $R_f$ is a fluorinated or partially fluorinated hydrophobic group, such as the following groups:

$$C_nF_{(2n+1)}—$$

$$C_nF_{(2n+1)}C_mH_{(2m+1)}—$$

$$C_nF_{(2n+1)}OCF_2CF_2—$$

$$C_nF_{(2n+1)}OC_6H_4—$$

$$—C_nF_{(2n+1)}CONH(CH_2)_3N=$$

$$C_nF_{(2n+1)}CH_2CH_2Si(CH_3)_2—$$

Wherein, m is an integer of 1 to 30, and n is an integer of 1 to 30.

The organic phenol compound containing two or three hydroxyl groups alone can allow anti-corrosive effects, but it cannot completely solve pitting, which is a partial erosion generated on a side or upper surface of lower metal wiring film material. As a result of studies, it has been discovered that mixing anion type compounds containing perfluoroalkyl group with the organic phenol compound containing two or three hydroxyl groups can prevent pitting. Specifically, it has been discovered that adding an anion type compound containing perfluoroalkyl group to an aromatic phenol compound causes synergetic effects for preventing side pitting generated on the side-wall of resist film.

The content of the anion type compound containing perfluoroalkyl group is preferably 0.1 to 10 wt %. If the content is less than 0.1 wt %, a pitting preventing performance will be insignificant. And, if the content exceeds 10 wt %, the viscosity of the resist remover composition will be increased thus lowering the convenience during use.

The (f) polyoxyethylene alkylamine ether-type surfactant is preferably selected from the compounds represented by the following Formula 3.

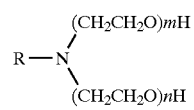

[Formula 3]

Wherein R is a C1-20 alkyl group, m is an integer of 0 to 30, and n is an integer of 0 to 30.

Since the polyoxyethylenealkyl amine ether-type surfactant shows weak cationic surfactant properties because of the added moles of ethylene oxides, it disperses resists dissolved in resist remover to decrease the possibility of redepositing on a metal film material.

The content of the polyoxyethylenealkyl amine ether-type surfactant is preferably 0.01 to 1 wt %.

DETAILED DESCRIPTION AND THE PREFERRED EMBODIMENTS

Figure 1:
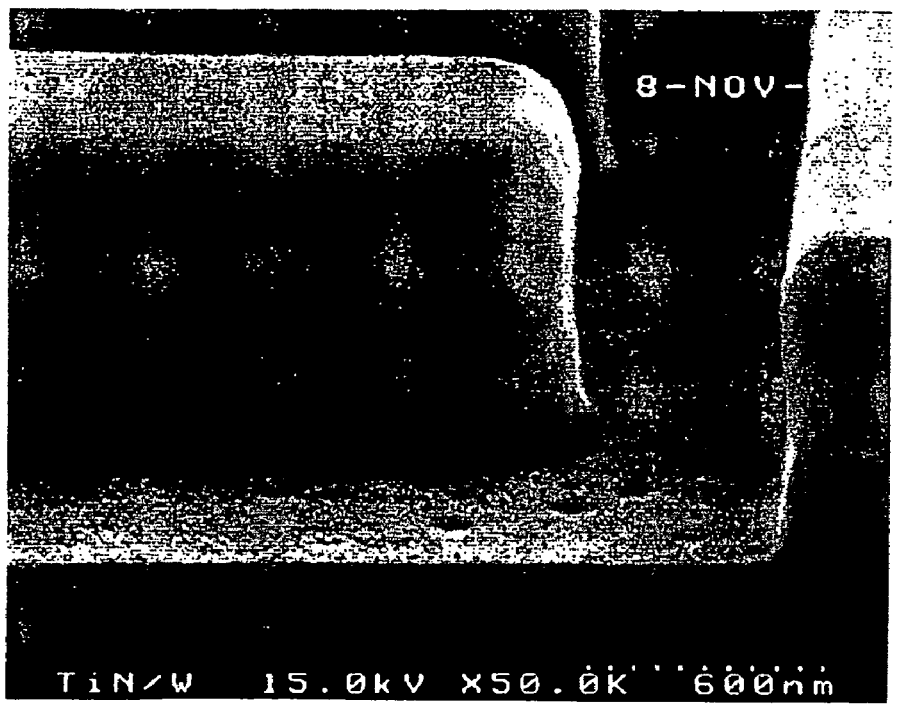
FIG. 1 shows the original states of a resist pattern under which 1000 Å of tungsten and 700 Å of titanium nitride layers are deposited.

The present invention will now be explained in more detail with reference to the following Examples. However, the scope of the present invention is not limited thereto. In addition, unless specifically indicated, the % and mixing ratios are based on weight. The performance evaluation for the resist remover composition of Examples and Comparative Examples is conducted by the following method.

(1) Resist Removal Performance

Preparation of Sample A On the surface of 8-inch silicon wafers on which 1000 Å of tungsten film and 700 Å of nitride film were deposited in that order, a commonly used positive resist composition (Mitsubishi Company Product, Trade name: IS401) was spin-coated such that the final film thickness reached 1.01 μm. The silicon wafers were pre-baked at 100° C. for 90 seconds on a hot plate. Masks having a predetermined pattern were placed on the resist film, ultraviolet rays were irradiated thereto, and the resist film was developed at 21° C. for 60 seconds using tetramethylammonium hydroxide (TMAH) developer (Dongjin Chemical Industry Company product, Trade name: DPD-100S). The wafers on which the resist patterns were formed were hard-baked at 120° C. for 100 seconds on a hot plate.

Using the resist patterns formed on the Samples A as a mask, a $SF_6/Cl_2$ gas mixture as etching gas, and using a dry etching apparatus (Hitachi Company product, Model name: M318), lower tungsten and nitride films that were not covered by the resist pattern were etched for 35 seconds to form a metal wiring pattern.

Resist Removal Test

The Samples A were immersed in a resist remover composition at 65° C. The sample was taken out of the resist remover composition, and then, it was washed with pure water and dried with nitrogen gases. It was examined to determine whether or not resist residues were deposited on the surface of line pattern and around side-wall of pattern using a SEM. The resist removal performance was evaluated on the basis of the following standard and the results are presented in Table 2.

○: Resist residues were completely removed from the side wall and surface of line pattern.

Δ: 80% or more of resist residues were removed fro the side wall and surface of line pattern, but small amount thereof remained.

X: Most of resist residues were not removed from side wall and the surface of line pattern.

(2) Copper Corrosion Test

Preparation of Sample B

A lead frame made of copper that is used during a semiconductor packaging process was prepared.

Copper Corrosion Test

The Samples B were immersed in a resist remover composition at 65° C. The samples were taken out of the resist remover composition, and then washed with pure water and dried with nitrogen gases. Then, the surfaces of the copper samples were examined using a SEM, and the degree of corrosion was evaluated on the basis of the following standards. The results are presented in Table 3.

○: No corrosion on the surface of the copper.

Δ: A part of the surface of the copper was corroded.

X: The whole surface of the copper was seriously corroded.

EXAMPLES 1 TO 5 AND COMPARATIVE EXAMPLES 1 to 3

The ingredients a) to f) of the composition of the present invention were mixed in a ratio as described in Table 1 to prepare each of the resist remover compositions of Examples 1 to 5 and Comparative Examples 1 to 3. The thus obtained resist remover compositions were tested for their (1) resist removal performances, and (2) copper corrosion propensity. The results are presented in Tables 2 and 3.

TABLE 1

| | | (a) Organic Amine Compound | | Hydroxyl Amine | (b) Organic Solvent | | (c) Water | (d) Organic Phenol Compound | | (e) Anion type Compound | | (f) Surfactant | |
|---|---|---|---|---|---|---|---|---|---|---|---|---|---|
| | | Type | Content | Content | Type | Content | Content | Type | Content | Type | Content | Type | Content |
| Example | 1 | MEA | 20 | — | NMP | 45 | 20 | Catechol | 13 | FPA-91 | 1.9 | KONIOL NM-10 | 0.1 |
| | 2 | MEA | 10 | — | DMF | 55 | 20 | Resorcin | 12 | FPA-91 | 2.5 | KONION LM-10 | 0.5 |
| | 3 | MIPA | 15 | — | DMSO | 65 | 10 | Resorcin | 5 | FPA-91P | 4.9 | KONION SM-15 | 0.1 |
| | 4 | MEA | 15 | — | NMP | 65 | 10 | Catechol | 8 | FPA-91 | 1.5 | KONION SM-15 | 0.5 |
| | 5 | MIPA | 30 | — | DMAc | 40 | 25 | Catechol | 3 | FPA-91P | 1 | KONION LM-10 | 1 |
| Comparative Example | 1 | MEA | 5 | 30 | NMP | 25 | 30 | Cresol | 9 | — | — | PEG | 1 |
| | 2 | MEA | 45 | 10 | DMF | 20 | 10 | Cresol | 14.5 | — | — | X-100 | 0.5 |
| | 3 | MIPA | 5 | 45 | DMAc | 30 | 15 | SA | 4.5 | — | — | PEG | 0.5 |

MIPA: monoisopropanol amine
MEA: monoethanolamine
DMSO: dimehtylsulfoxide
DMF: dimethylformamide
NMP: N-methylpyrrolidone
DMAc: dimethylacetamide
FPA-91: anion type compound containing fluoroalkyl group (DIC Company product)
FPA-91P: fluoroalkyl group-containing anion type compound (DIC Company product)
KONION LM-10: polyoxyethylenealkylamine ether (Korean Polyol Company product)
KONION SM-15: polyoxyethylene alkylamine ether (Korean Polyol Company product)
KONIOM SM-10: polyoxyethylene alkylamine ether (Korean Polyol Company product)
SA: salicylic aldehyde

TABLE 2

Resist Removal Performance of Resist Remover Composition

| Immersion Time | | 5 minutes | 10 minutes | 20 minutes |
|---|---|---|---|---|
| Example | 1 | ○ | ○ | ○ |
| | 2 | ○ | ○ | ○ |
| | 3 | Δ | ○ | ○ |
| | 4 | ○ | ○ | ○ |
| | 5 | Δ | ○ | ○ |
| Comparative | 1 | X | X | X |

TABLE 2-continued

Resist Removal Performance of Resist Remover Composition

| Immersion Time | | 5 minutes | 10 minutes | 20 minutes |
|---|---|---|---|---|
| Example | 2 | X | Δ | Δ |
| | 3 | X | Δ | Δ |

Figure 2:
FIG. 2 is a SEM photo showing the results of a resist removal performance test using the resist remover composition of Example 4 at 65° C.
Figure 3:
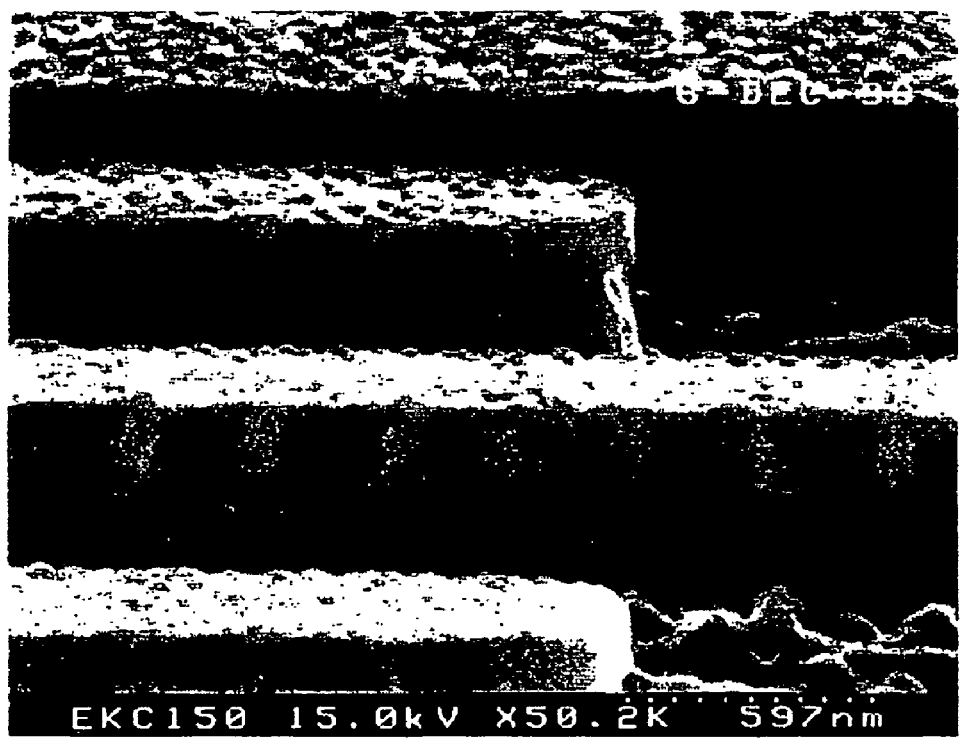
FIG. 3 is a SEM photo showing the results of a resist removal performance test using the resist remover composition of Comparative Example 1 at 65° C.

FIGS. 1 to 3 are SEM (Hitachi Company, Model Name: S-4100) photos comparing the resist removal performance of the resist remover composition of Example 4 with that of Comparative Example 1, showing the results of testing Sample A at a temperature of resist remover composition of 65° C.

FIG. 1 confirms the original state of the resist pattern on which 1000 Å of tungsten and 700 Å of titanium nitride films were deposited.

FIG. 2 is a SEM photo showing the results of testing resist removal performance using the resist remover composition of Example 4 at 65° C.

FIG. 3 is a SEM photo showing the results of a resist removal performance test using the resist remover composition of Comparative Example 1 at 65° C.

TABLE 3

| Immersion Time | | 5 minutes | 10 minutes | 20 minutes |
|---|---|---|---|---|
| Example | 1 | ○ | ○ | Δ |
| | 2 | ○ | ○ | ○ |
| | 3 | ○ | ○ | ○ |
| | 4 | ○ | ○ | Δ |
| | 5 | ○ | ○ | ○ |
| Comparative Example | 1 | Δ | Δ | X |
| | 2 | ○ | Δ | X |
| | 3 | ○ | ○ | X |

As the above shows, the resist remover composition according to the present invention can easily and quickly remove resist film cured by dry etching, ashing and ion implantation processes and those modified by metallic side-products etched from lower metal film materials during said processes. It can also minimize the corrosion of lower metal wiring, particularly copper wiring during the resist removal process, and it can be rinsed with water without need a to use organic solvents such as isopropyl alcohol, dimethylsulfoxide, etc.

What is claimed is:

1. A resist remover composition comprising (a) 10 to 40 wt % of a water-soluble organic amine compound, (b) 40 to 70 wt % of water-soluble organic solvents selected from a group consisting of dimethyl sulfoxide (DMSO), N-methylpyrrolidone (NMP), dimethylacetamide (DMAc), dimethylformamide (DMF) and a mixture thereof, (c) 10 to 30 wt % of water, (d) 5 to 15 wt % of an organic phenol compound containing two or three hydroxyl groups, (e) 0.5 to 5 wt % of anion type compound containing perfluoroalkyl group, and (1) 0.01 to 1 wt % of polyoxyethylenealkylamine ether-type surfactant.

2. The resist remover composition according to claim 1, wherein the water-soluble organic amine is an amino-alcohol compound.

3. The resist remover composition according to claim 2, wherein the amino-alcohol compound is selected from a group consisting of 2-amino-1-ethanol, 1-amino-2-propanol, 2-amino-1-propanol, 3-amino-1-propanol and a mixture thereof.

4. The resist remover composition according to claim 1, wherein the organic phenol compound containing two or three hydroxyl groups is a phenol compound represented by the following Formula 1:

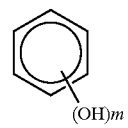

[Formula 1]

Wherein m is an integer of 2 or 3.

5. The resist remover composition according to claim 1, wherein the anion type compound containing perfluoroalkyl group is selected from a group consisting of the compounds represented by the following Formula 2:

$R_fCOO^-M^+$ $R_fSO_3^-M^+$ $R_fSO_4^-M^+$ $R_fOP(O)O_2^{2-}M_2^+$ [Formula 2]

Wherein, Rf is fluorinate or a partially fluorinated hydrophobic group, M+ is an inorganic or organic counter ion, Rf is selected from a group consisting of the groups represented by the following formulae:

$C_nF_{(2n+1)}-$ $C_nF_{(2n+1)}C_mH_{(2m+1)}-$ $C_nF_{(2n+1)}OCF_2CF_2-$ $C_nF_{(2n+1)}OC_6H_4-$ $-C_nF_{(2n+1)}CONH(CH_2)_3N=$ $C_nF_{(2n+1)}CH_2CH_2Si(CH_3)_2-$

Wherein m is an integer of 1 to 30, and n is an integer of 1 to 30.

6. The resist remover composition according to claim 1, wherein the polyoxyethylenealkyl amine ether-type surfactant is a compound represented by the following formula 3:

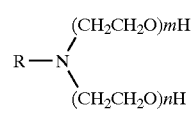

[Formula 3]

Wherein R is a C1-20 alkyl group, m is an integer of 0 to 30, and n is an integer of 0 to 30.

* * * * *